United States Patent
Park et al.

(10) Patent No.: US 7,292,103 B2
(45) Date of Patent: Nov. 6, 2007

(54) AMPLIFIER SYSTEM HAVING COMPENSATED AMPLIFICATION VARIATION

(75) Inventors: Chul Hong Park, San Jose, CA (US); James Nicholas Wholey, Saratoga, CA (US)

(73) Assignee: Avago Technologies Wireless IP (Singapore) Pte Ltd, Singapore (SG)

(*) Notice: Subject to any disclaimer, the term of this patent is extended or adjusted under 35 U.S.C. 154(b) by 166 days.

(21) Appl. No.: 11/107,284

(22) Filed: Apr. 14, 2005

(65) Prior Publication Data
US 2006/0232338 A1 Oct. 19, 2006

(51) Int. Cl.
*H03G 3/10* (2006.01)
*H03G 3/30* (2006.01)

(52) U.S. Cl. .......... 330/280; 330/129

(58) Field of Classification Search .......... 330/280, 330/310, 202
See application file for complete search history.

(56) References Cited

U.S. PATENT DOCUMENTS

| | | | |
|---|---|---|---|
| 4,415,868 A | 11/1983 | Gross | |
| 5,974,041 A | 10/1999 | Kornfeld et al. | |
| 6,600,369 B2* | 7/2003 | Mitzlaff | 330/149 |
| 6,677,821 B2* | 1/2004 | Kusunoki et al. | 330/149 |
| 6,771,130 B2* | 8/2004 | Hasegawa et al. | 330/302 |
| 6,812,789 B2 | 11/2004 | Mackey et al. | |
| 6,864,742 B2* | 3/2005 | Kobayashi | 330/124 R |

* cited by examiner

*Primary Examiner*—Robert Pascal
*Assistant Examiner*—Alan Wong

(57) ABSTRACT

An amplifier system is provided for amplifying an input signal to provide an amplified output signal, amplifying an amplified input signal to provide a further amplified output signal, and phase delay compensating variations of the amplifications of the amplified output signal and the further amplified output signal for providing the further amplified output signal with substantially linear amplification under a variable load.

18 Claims, 2 Drawing Sheets

AMPLIFIER SYSTEM HAVING COMPENSATED AMPLIFICATION VARIATION

TECHNICAL FIELD

The present invention relates generally to amplifier systems, and more particularly to power amplifier systems.

BACKGROUND ART

A power amplifier is an electronic device which is used to increase the power of a signal in wireless transmitters, broadcast transmitters, and high fidelity audio equipment. The power of a signal is increased by taking power from a power supply and shaping the output signal to match the input signal.

The amplification factor, also called gain, is the extent to which an amplifier boosts the strength of a signal. The gain of an amplifier can be increased by cascading, that is, hooking up one amplifier after another.

One basic power amplifier system includes two stages. The first stage of amplification or gain can be from a field effect transistor (FET) that is set up to deliver its output power into a relatively high impedance at the operating frequency. The input of the second stage of amplification can be the gate of a large FET that has a very low input impedance. The amplifier system will include an inner stage-matching system to transform the low input impedance of the second stage to the high output impedance for the first stage. Often the first stage provides a higher gain than the second stage while the second stage is physically larger than the first stage to provide higher power.

A simple approach for achieving inner stage-matching is by using an inductor and capacitor combination. The inductor is connected to a voltage source at one end and to between the first stage and second stage amplifiers at the other end. The capacitor is connected in series between the inductor connection and the second stage amplifier. This configuration will cause the operating frequency to supply the correct impedance transformation. There will also be a certain phase shift of the signal that goes through the inner stage-matching, and it will only operate at a single frequency over a relatively narrow band. Further, selection of the components for the inductor and capacitor combination will be very critical.

Other approaches are used in many different types of electrical devices but have problems in certain applications. For example, when these amplifier systems are used in wireless communication devices, such as, but not limited to, cell phones, and connected to the cell phone antenna for transmitting and receiving signals, various non-linearities in the signal occur resulting in the power output of the cell phone antenna becoming highly non-linear resulting in unwanted interferring signals, the power output sometimes possibly dropping so no signal is transmitted, and the current requirement increasing to sometimes drain the cell phone batteries.

One reason for these problems is that the amplifier systems when connected to the cell phone antenna are designed to provide power for transmitting a signal into free space where the antenna load impedance to the signal is 50 ohms. When a cell phone user places the antenna near metallic objects such as the hood of a car, the roof, or the dashboard, this causes various reflective waves. The reflective waves change the impedance so the antenna load impedance is no longer 50 ohms but greatly increases or decreases. For a voltage standing wave ratio of 5 to 1, the antenna load impedance will range from about 10 ohms to about 250 ohms.

When the antenna load impedance starts to vary because of reflective waves, variations in gain will end up causing the various non-linearities and too much current consumption to occur. These non-linearities are particularly troublesome in a cell phone, because power broadcast into one cell phone channel will end up overflowing into adjacent channels. The power going into adjacent channels will ultimately limit the overall capacity of how many cell phone calls can be transmitted on a single frequency.

For any amplifier system to be used where major changes in load are possible, it is desirable to be able to have a linear power output. It should be noted that the amount of power to be delivered is less important than the fact that the power is provided linearly.

Further, since many modem electronic devices operate primarily on battery power, it is desirable to have a linear power output with the maximum power output itself lower than a fixed level when the load is variable. When the maximum power output is low, the current drain from the battery is minimized, and therefore the battery can maintain its voltage.

Also, while the load is varying, it is also desirable to be assured of having a minimum power output to assure continued operation of the electronic device.

Another approach has been to have a balanced power amplifier system, which uses two parallel lines with splitters, phase shifters, and combiners to balance each other to compensate for variable loads. Unfortunately, the additional components not only increase cost but physical size, but also impose additional power consuming components which more quickly drain the cell phone batteries. This power loss is incurred even when the antenna load impedance is constant at 50 ohms.

Solutions to these problems have been long sought but prior developments have not taught or suggested any solutions and, thus, solutions to these problems have long eluded those skilled in the art.

DISCLOSURE OF THE INVENTION

The present invention provides an amplifier system for amplifying an input signal to provide an amplified output signal, amplifying an amplified input signal to provide a further amplified output signal, and phase delay compensating variations of the amplifications of the amplified output signal and the further amplified output signal for providing the further amplified output signal with substantially linear amplification under a variable load.

Certain embodiments of the invention have various advantages in addition to those apparent from the above. These advantages will become apparent to those skilled in the art from a reading of the following detailed description when taken with reference to the accompanying drawings.

BEST MODE FOR CARRYING OUT THE INVENTION

Figure 1:
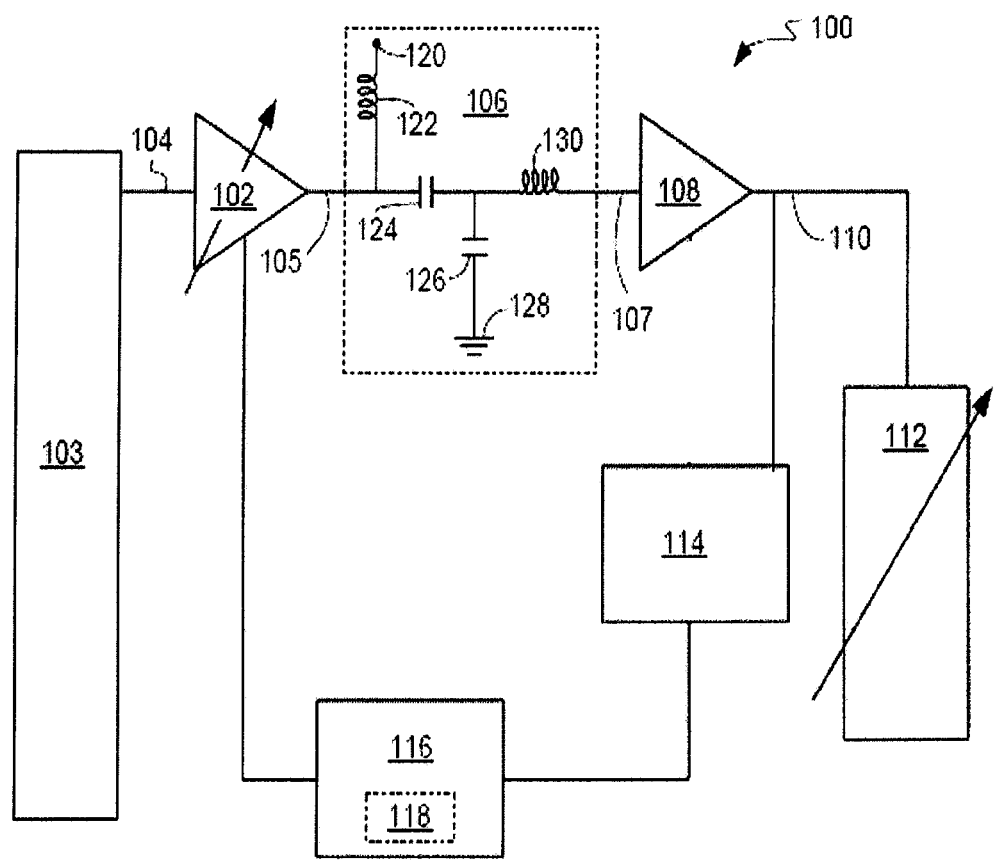
FIG. 1 is a schematic of an amplifier system in accordance with an embodiment of the present invention.

In the following description, numerous specific details are given to provide a thorough understanding of the invention. However, it will apparent that the invention may be practiced without these specific details. In order to avoid obscuring the present invention, some well-known system configurations and process steps are not disclosed in detail.

Likewise, the drawings showing embodiments of the invention are semi-diagrammatic and not to scale. In addition, where multiple charts are disclosed and described having some features in common, for clarity and ease of illustration and description thereof like axes one to another will ordinarily be described with like reference numerals.

Referring now to FIG. 1, therein is shown a schematic of a power amplifier system 100 in accordance with an embodiment of the present invention.

The power amplifier system 100 has a first stage amplifier 102. The first stage amplifier 102 in some embodiments is a variable amplifier. The first stage amplifier 102 has an input 104 connected to electronic circuitry 103, such as a transceiver in a cell phone. The first stage amplifier 102 has an output 105, which needs to feed into high impedance, such as 30 to 40 ohms. The output 105 feeds into a phase delay compensated impedance matching system 106.

The phase delay compensated impedance matching system 106 provides an output 107 into a second stage amplifier 108, which has a small gain compared to the first stage amplifier 102. The input of the second stage amplifier 108 has low impedance, such as 2 to 5 ohms. The second stage amplifier 108 is described as being operatively connected to the first stage amplifier 102 and has an output 110.

For purposes of illustration only, the output 110 is connected to a variable load 112. In a cell phone, the variable load 112 is an antenna for transmitting into free space, which has an impedance of about 50 ohms. When a cell phone user places the antenna near metallic objects such as the hood of a car, the roof, or the dashboard, this causes various reflective waves. The reflective waves causes drastic changes in the impedance so the antenna load impedance is no longer 50 ohms but the antenna load impedance will range from about 10 ohms to about 250 ohms for a voltage standing wave ratio of 5 to 1.

While the second stage amplifier 108 sees the direct impact of the varying variable load 112, the first stage amplifier 108 sees the variation indirectly through the second stage amplifier 108. Since the first stage amplifier 102 typically has higher gain, the gain variation of each stage is about the same in magnitude.

Optionally, the second stage amplifier 108 is connected to an amplification or gain detector 114, such as a voltage sensor. The gain detector 114 is connected to a feedback circuitry 116, such as in inverter. The feedback circuitry 116 can optionally contain a control 118, which could be hard-wired or adjustable. The feedback circuitry 116 is connected to adjust the amplification or gain of the first stage amplifier 102.

The phase delay compensated impedance matching system 106 by its architecture provides phase delay compensation of amplification variation and can be composed of numerous different components in different configurations. In one simple, exemplary arrangement, the output 105 is connected to a voltage source 120 by a first inductor 122. The output 105 is further connected by a first and second capacitors 124 and 126 to a ground 128. A second inductor connects the common plates of the first and second capacitors 124 and 126 to the output 107.

The components of the phase delay compensated impedance matching system 106 through its impedance matching design has values, which assure that the first stage amplifier 102 is connected into a high impedance as required and the second stage amplifier 108 is connected to a low impedance input as required.

In one embodiment of the present invention, it has been discovered that phase compensation of amplification or gain variation as claimed in the present invention can be performed in amplifier systems having two or more stages.

This is the result of the realization that gain variation is a function of phase and that the phase delay compensated impedance matching system 106, in addition to providing the proper impedances for the amplifiers, can produce a different phase shift for the gain variation of the first stage amplifier 102 relative to the gain variation of the second stage amplifier 108. This can be repeated for additional stages of amplification so the gain variations of all the amplifiers can be compensated. The compensation of the gain variations allows control of the output linearity and power output of the power amplifier system 100.

Figure 2:
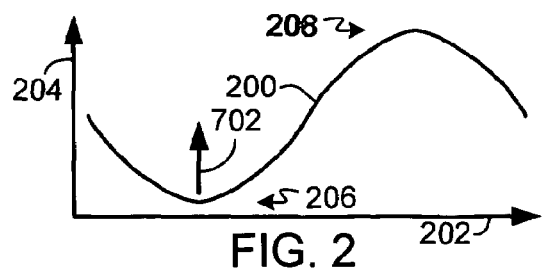
FIG. 2 is a graph of an output linearity curve of the second stage amplifier of FIG. 1.
Figure 3:
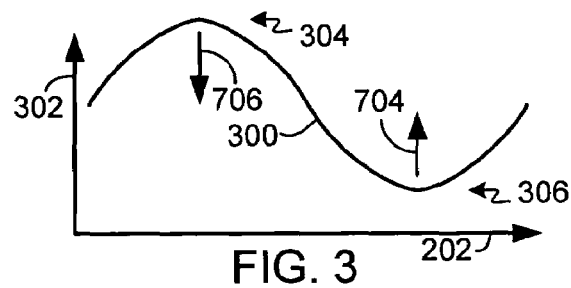
FIG. 3 is a graph of a power output curve of the second stage amplifier of FIG. 1.
Figure 4:
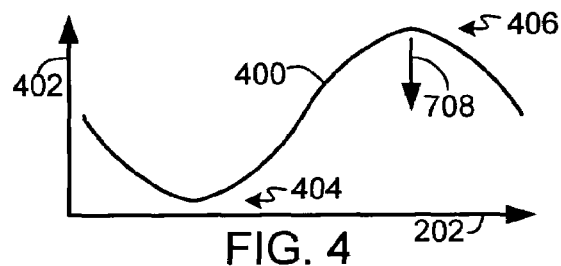
FIG. 4 is a graph of a current output curve of the second stage amplifier of FIG. 1.

In order to better understand the present invention, FIGS. 2 through 4 are provided showing output linearity, power output, and current output curves, respectively, for the second stage amplifier 108.

Referring now to FIG. 2, therein is shown a graph of an output linearity curve 200 of the second stage amplifier 108 of FIG. 1. The output linearity curve 200 shows variations possible in the gain of the power amplifier system 100 and is shown on a graph having a phase axis 202 and a linearity axis 204. The output linearity curve 200 has a worst output linearity point 206 and a best output linearity point 208.

Referring now to FIG. 3, therein is shown a graph of a power output curve 300 of the second stage amplifier 108 of FIG. 1. The power output curve 300 is shown on a graph having the phase axis 202 and a power output axis 302. The power output curve 300 has a maximum power output point 304 and a minimum power output point 306. If the maximum power output point 304 is too high, the power will cause problems in signal channels adjacent to the desired signal channel, and if the minimum power output point 306 is too low, the signal will be too low to be transmitted any required distance.

Referring now to FIG. 4, therein is shown a graph of a current output curve 400 of the second stage amplifier 108 of FIG. 1. The current output curve 400 is shown on a graph having the phase axis 202 and a current axis 402. The current output curve 400 has a minimum current output point 404 and a maximum current output point 406. The higher the maximum current output point 406, the faster the batteries of the electronic circuitry 103 will be drained.

Figure 5:
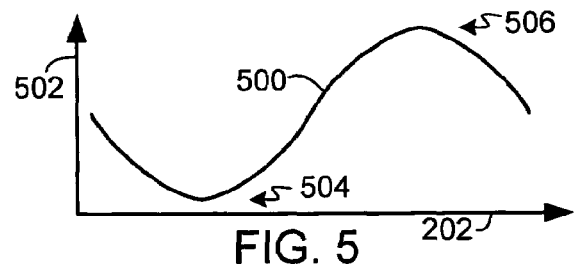
FIG. 5 is a graph of a gain curve of the first stage amplifier of FIG. 1.

Referring now to FIG. 5, therein is shown a graph of a gain curve 500 out of the first stage amplifier 102. The gain curve 500 is shown on a graph having the phase axis 202 and a gain axis 502. The gain curve 500 has a minimum gain point 504 and a maximum gain point 506.

Figure 6:
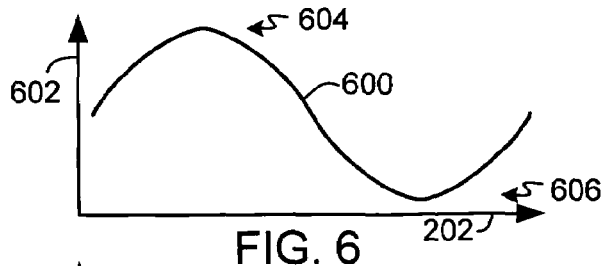
FIG. 6 is a graph of a gain curve of the second stage amplifier of FIG. 1.

Referring now to FIG. 6, therein is shown graph of a gain curve 600 out of the second stage amplifier 108. The gain curve 600 is shown on a graph having the phase axis 202 and a gain axis 602. The gain curve 600 has a maximum gain point 604 and a minimum gain point 606.

The gain curve 600 of FIG. 6 of the second stage amplifier 108 can be delayed and out of phase with the gain curve 500 of FIG. 5 of the first stage amplifier 102 by the values of the impedance of the phase delay compensated impedance matching system 106.

Figure 7:
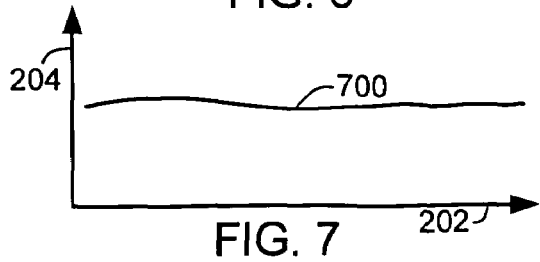
FIG. 7 is a graph of a phase delay compensated gain curve of the second stage amplifier of FIG. 1.

Referring now to FIG. 7, therein is shown a graph of a phase delay compensated gain curve 700, which occurs when there is about an 180° phase delay between the output of the first stage amplifier 102 of FIG. 1 and the input of the second stage amplifier 108. The gain out of the second stage amplifier 108 would be substantially linear.

It was understood that any variation in the variable load 112 is fed back through the second stage amplifier 108, the phase delay compensated impedance matching system 106, and the first stage amplifier 102 to usually detrimentally affect these components. This led to the realization that proper selection of the architecture of the phase delay compensated impedance matching system 106 could cause the gain variation in the second stage amplifier 108 to compensate for the gain variation in the first stage amplifier 102 such that the gain variation out of the second stage amplifier 108 will be substantially linear. This would make the power amplifier system 100 insensitive to even major variations in the variable load 112.

It has been discovered that, by controlling the degree of phase delay of the phase delay compensated impedance matching system 106, it is possible to control the gain variation of the power amplifier system 100. This means the characteristics of linearity, maximum power output, and minimum power output can be controlled as required for a particular application as evident in FIGS. 2-4.

For example, as the phase delay of the second stage amplifier 108 is set closer to 180°, the worst output linearity point 206 will improve in the direction indicated by an arrow 702 in FIG. 2. At the same time, the minimum power output point 306 will increase in the direction indicated by an arrow 704 of FIG. 3 and the maximum power output point 304 will decrease in the direction indicated by an arrow 706. Thus, as the phase delay of the second stage amplifier 108 approaches 180°, the minimum power output point 306 can be set to assure that there is always enough power to transmit and the maximum power output point 304 can be set to assure that power does not overflow to cause problems in adjacent signal channels.

It has also been discovered that the changing impedance of the variable load 112 of FIG. 1 will be fed back to affect the both the first and second stage amplifiers 102 and 108, which means that the phase relationship between the two will not change. Thus, the gain linearity, maximum power, and minimum power will not change substantially and are insensitive to load.

Referring back now to FIG. 1, it has been discovered that by the addition of the gain detector 114 and the feedback circuitry 116, the gain of the first stage amplifier 102 can be controlled to control the maximum current output. As the gain of the first stage amplifier 102 is decreased, the maximum current output point 406 will decrease in the direction indicated by an arrow 708 of FIG. 4. This means that it is possible to increase battery life despite major variations in antenna load in a cell phone.

Figure 8:
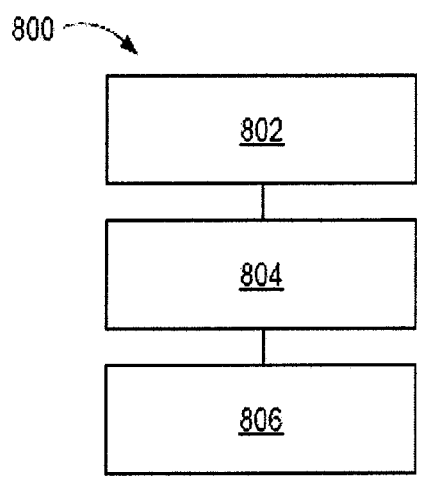
FIG. 8 is an amplifier system operating in accordance with another embodiment of the present invention.

Referring now to FIG. 8, therein is shown an amplifier system 800 operating in accordance with another embodiment of the present invention. The amplifier system 800 includes amplifying an input signal to provide an amplified output signal in a block 802; amplifying an amplified input signal to provide a further amplified output signal in a block 804; and phase delay compensating variations of the amplifications of the amplified output signal and the further amplified output signal for providing the further amplified output signal with substantially linear amplification under a variable load in a block 806.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method comprising:
   amplifying an input signal to provide an amplified output signal;
   amplifying an amplified input signal to provide a further amplified output signal; and
   phase delay compensating variations of the amplifications of the further amplified output signal with amplifications of the amplified output signal for providing the further amplified output signal with substantially linear amplification under a variable load wherein phase delay compensating variations of the amplifications further comprises phase delay compensating the amplification variations for controlling maximum power of the further amplified output signal.

2. The method as claimed in claim 1 wherein phase delay compensating variations of the amplifications maintains the phase relationship of the amplified output signal and the further amplified output signal.

3. The method as claimed in claim 1 further comprising impedance matching of the amplified output signal and the amplified input signal.

4. The method as claimed in claim 1 wherein phase delay compensating variations of the amplifications further comprises phase delay compensating the amplification variations only for linearity.

5. The method as claimed in claim 1 wherein:
   amplifying the further amplified output signal further comprises determining the amplification of the further amplified output signal; and
   amplifying the input signal further comprises adjusting the amplification of the input signal based on the amplification of the further amplified output signal to control maximum current output of the further amplified output signal.

6. The method as claimed in claim 1 further comprising:
   transmitting the further amplified output signal as a cell phone signal.

7. An amplifier system comprising:
   a first stage amplifier;
   a second stage amplifier operatively connected to the first stage amplifier; and
   a phase delay compensated impedance matching system for phase delay compensating variations of the amplifications of the first and second stage amplifiers to provide substantially linear amplification under a variable load, wherein the phase delay compensated impedance matching system further comprises circuitry for phase shifting the gain variations to control maximum output power, minimum output power, or a combination thereof of the second stage amplifier.

8. The amplifier system as claimed in claim 7 wherein the phase delay compensated impedance matching system further comprises phase delay compensating circuitry for maintaining the phase relationship between the first and second stage amplifiers.

9. The amplifier system as claimed in claim 7 wherein the phase delay compensated impedance matching system further comprises impedance matching circuitry for controlling impedance at an output of the first stage amplifier and impedance at an input of the second stage amplifier.

10. The amplifier system as claimed in claim 7 wherein the phase delay compensated impedance matching system further comprises phase delay circuitry for phase shifting the amplification variations to compensate the amplification variations only for linearity.

11. The amplifier system as claimed in claim 7 wherein the phase delay compensated impedance matching system further comprises phase delay circuitry for shifting the amplification variations to control output power of the second stage amplifier.

12. An amplifier system comprising:
electronic circuitry for providing a transceiver signal;
a first stage amplifier connected to the electronic circuitry;
a second stage amplifier operatively connected to the first stage amplifier; and
a phase delay compensated impedance matching system connected to the first and second stage amplifiers for phase delay compensating variations of the gains of the first and second stage amplifiers to provide substantially linear amplifier system amplification under a variable load, wherein the phase delay compensated impedance matching system further comprises circuitry for phase shifting the gain variations to control maximum output power, minimum output power, or a combination thereof of the second stage amplifier.

13. The amplifier system as claimed in claim 12 wherein the phase delay compensated impedance matching system further comprises phase delay circuitry for maintaining the phase delay between the first and second stage amplifiers.

14. The amplifier system as claimed in claim 12 further comprising:
a gain detector connected to the second stage amplifier to detect the gain thereof; and
feedback circuitry connected to the gain detector to change the gain of the first stage amplifier based on the gain of the second stage amplifier to control the maximum current output of the second stage amplifier.

15. The amplifier system as claimed in claim 12 further comprising:
an antenna connected to the second stage amplifier for transmitting the transceiver signal into 50-ohm free space.

16. A method, comprising:
amplifying an input signal to provide an amplified output signal;
amplifying an amplified input signal to provide a further amplified output signal; and
phase delay compensating variations of the amplifications of the further amplified output signal with amplifications of the amplified output signal to provide the further amplified output signal with substantially linear amplification under a variable load, and phase delay compensating the amplification variations to control minimum power of the further amplified output signal.

17. An amplifier system comprising:
a first stage amplifier;
a second stage amplifier operatively connected to the first stage amplifier;
a phase delay compensated impedance matching system adapted to phase delay compensate variations of the amplifications of the first and second stage amplifiers to provide substantially linear amplification under a variable load;
a detector connected to the second stage amplifier adapted to detect the amplification thereof; and
feedback circuitry connected to the detector adapted to change the amplification of the first stage amplifier based on the amplification of the second stage amplifier to control the maximum current output of the second stage amplifier.

18. An amplifier system comprising:
electronic circuitry for providing a transceiver signal;
a first stage amplifier connected to the electronic circuitry;
a second stage amplifier operatively connected to the first stage amplifier; and
a phase delay compensated impedance matching system connected to the first and second stage amplifiers adapted to phase delay compensate variations of the gains of the first and second stage amplifiers to provide substantially linear amplifier system amplification under a variable load, wherein the phase delay compensated impedance matching system further comprises circuitry adapted to provide a high impedance at an output of the first stage amplifier and a low impedance at an input of the second stage amplifier.

* * * * *